United States Patent
Nadar et al.

(10) Patent No.: US 9,466,102 B2
(45) Date of Patent: Oct. 11, 2016

(54) MULTI-GPU FISTA IMPLEMENTATION FOR MR RECONSTRUCTION WITH NON-UNIFORM K-SPACE SAMPLING

(71) Applicant: Siemens Corporation, Iselin, NJ (US)

(72) Inventors: Mariappan S. Nadar, Plainsboro, NJ (US); Steven Martin, Columbus, OH (US); Alban Lefebvre, Jersey City, NJ (US); Jun Liu, Cary, NC (US)

(73) Assignee: SIEMENS CORPORATION, Iselin, NJ (US)

(*) Notice: Subject to any disclaimer, the term of this patent is extended or adjusted under 35 U.S.C. 154(b) by 0 days.

(21) Appl. No.: 14/031,374

(22) Filed: Sep. 19, 2013

(65) Prior Publication Data

US 2014/0085318 A1    Mar. 27, 2014

Related U.S. Application Data

(60) Provisional application No. 61/705,694, filed on Sep. 26, 2012.

(51) Int. Cl.
*G06F 15/80* (2006.01)
*G06T 7/00* (2006.01)
*G01R 33/56* (2006.01)
*G01R 33/48* (2006.01)

(52) U.S. Cl.
CPC ......... *G06T 7/0012* (2013.01); *G01R 33/5608* (2013.01); *G01R 33/4824* (2013.01)

(58) Field of Classification Search
CPC .......... G06T 2207/30004; G06T 2207/10088; G06T 7/0012; G06F 19/3437; G01R 33/5611; G01R 33/4818; G01R 33/385
See application file for complete search history.

(56) References Cited

U.S. PATENT DOCUMENTS

2007/0014486 A1*  1/2007  Schiwietz et al. ............ 382/276
2013/0271757 A1* 10/2013  Kang et al. .................. 356/300

* cited by examiner

*Primary Examiner* — Hau Nguyen

(57) ABSTRACT

A system for performing image reconstruction in a multi-threaded computing environment includes one or more central processing units executing a plurality of k-space components and a plurality of graphic processing units executing a reconstruction component. The k-space components executing on the central processing units include a k-space sample data component operating in a first thread and configured to receive k-space sample data from a first file interface; a k-space sample coordinate data component operating in a second thread and configured to receive k-space sample coordinate data from a second file interface; and a k-space sample weight data component operating in a third thread and configured to retrieve k-space sample weight data from a third file interface. The reconstruction component is configured to receive one or more k-space input data buffers comprising the k-space sample data, the k-space sample coordinate data, and the k-space sample weight data from the one or more central processing units, and reconstruct an image based on the input data buffers using an iterative reconstruction algorithm.

19 Claims, 6 Drawing Sheets

MULTI-GPU FISTA IMPLEMENTATION FOR MR RECONSTRUCTION WITH NON-UNIFORM K-SPACE SAMPLING

CROSS-REFERENCE TO RELATED APPLICATIONS

This application claims priority to U.S. provisional application Ser. No. 61/705,694 filed Sep. 26, 2012, which is incorporated herein by reference in its entirety.

TECHNOLOGY FIELD

The present invention relates generally to methods, systems, and apparatuses for using a parallel computing environment to reconstruct images from, for example, radial or other non-uniformly sampled k-space data. The disclosed methods, systems, and apparatuses may be applied to, for example, increase the speed and accuracy of Magnetic Resonance Imaging reconstruction.

BACKGROUND

A magnetic resonance imaging ("MRI") device is an imaging device that uses powerful magnets and radio waves to create images of the body. In order to create these images, the MRI device, or its related software or hardware, must perform a process known as reconstruction. Reconstruction is a mathematical process that converts composite samples obtained by the MRI device into an image.

The quality of a reconstructed image is dependent, in part, on the number of samples used to generate the image. However, factors such as the physical constraints of MRI device make it desirable to provide high reconstruction quality for a limited number of samples. Sparse reconstruction algorithms such as the Fast Iterative Shrinkage-Thresholding Algorithm ("FISTA") are designed to address this problem by reducing the number of samples required per temporal phase for a fixed quality level. However, such reconstruction algorithms are computationally intensive and require relatively long processing times. Thus, it would be desirable to address these computational requirements such that the benefits of sparse reconstruction algorithms may be leveraged, while the processing time required to reconstruct an image from a given number of MR samples is minimized.

SUMMARY

Embodiments of the present invention address and overcome one or more of the above shortcomings and drawbacks, by providing methods, systems, and apparatuses for using a parallel computing environment to reconstruct images from, for example, radial or other non-uniformly sampled k-space data. More specifically, to support a multi-processor environment in the context of streaming MR data and the FISTA algorithm, the following components were developed: a threaded data-flow architecture enabling overlapping of I/O with computations; a Multi-processor BIMap Coil Sensitivity Map ("CSM") Estimator; a Multi-processor Fourier transforms with CSM-weighted sum reductions; and Multi-GPU Redundant Haar transforms.

According to some embodiments, a system for performing image reconstruction in a multi-threaded computing environment includes one or more central processing units executing a plurality of components and a plurality of graphic processing units executing a reconstruction component. The components executing on the central processing units include a k-space sample data component operating in a first thread and configured to receive k-space sample data from a first file interface; a k-space sample coordinate data component operating in a second thread and configured to receive k-space sample coordinate data from a second file interface; and a k-space sample weight data component operating in a third thread and configured to retrieve k-space sample weight data from a third file interface. The reconstruction component is configured to receive one or more k-space input data buffers comprising the k-space sample data, the k-space sample coordinate data, and the k-space sample weight data from the one or more central processing units, and reconstruct an image based on the input data buffers using an iterative reconstruction algorithm In some embodiments, the plurality of components executing on the central processing units further comprise one or more copy components. A k-space sample data copy component operating in a fourth thread is configured to transfer the k-space sample data from the k-space sample data file reader component to the graphic processing units in a first k-space input data buffer. A k-space sample coordinate data copy component operating in a fifth thread is configured to transfer the k-space sample coordinate data from the k-space sample coordinate data file reader component to the graphic processing units in a second k-space input data buffer. A k-space sample weight data copy component operating in a sixth thread is configured to transfer the k-space sample weight data from the k-space sample weight data file reader component to the graphic processing units in a third k-space input data buffer. In one embodiment, the first k-space input data buffer, the second k-space input data buffer, and the third k-space input data buffer each comprise synchronized multi-element data structures. In one embodiment, each of the plurality of components executes in parallel on the one or more central processing units.

According to some embodiments of the present invention, the reconstruction component is further configured to distribute k-space input data buffers channel-wise across the plurality of graphical processing units. At each graphical processing unit, a coil sensitivity map is estimated using a subset of the k-space input data buffers distributed to the respective graphical processing unit. The iterative reconstruction algorithm is executed using the k-space input data buffers and the coil sensitivity maps distributed across the graphical processing units. In one embodiment, the k-space input data buffers is distributed to each graphical processing unit based on a number of available graphical processing units.

According to one embodiment of the present invention, the reconstruction component is further configured to apply an inverse Non-Uniform Discrete Fourier Transform to the k-space input data buffers to yield a plurality of first image space buffers, each first image space buffer corresponding to a unique channel and a unique temporal phase. Next, the first image space buffers are multiplied by an element-wise conjugate of the coil sensitivity map images to produce a plurality of second image space buffers. Then, the second image space buffers are aggregated together for each temporal phase, to produce a plurality of resulting image space buffers, each resulting image space buffer corresponding a distinct temporal phase. In one embodiment, the reconstruction component is further configured to distribute each resultant image space buffer to a distinct graphical processing unit included in the plurality of graphic processing units. In one embodiment, the reconstruction component is further configured to multiply the resultant image space buffers by the coil sensitivity map images to yield a plurality of processed image space buffers, each processed image space buffer corresponding to a unique channel and a unique temporal phase. Then, a Non-Uniform Discrete Fourier Transform is applied to each processed image space buffer to create a plurality of resultant k-space data buffers, each resultant k-space data buffer corresponding to a unique channel and a unique temporal phase. Inter-device communication may be used between the graphical processing units when multiplying samples from the image space by the coil sensitivity map images.

According to other embodiments of the present invention, a system for performing image reconstruction in a multi-threaded computing environment includes one or more central processing units executing a plurality of k-space components and a graphic processing unit device comprising a plurality of graphical processing units. The central processing units execute in parallel and are configured to receive k-space input data. The graphical processing unit device is configured to receive a plurality of k-space input data buffers comprising the k-space input data from the k-space components and distribute the k-space input data channel-wise across the graphical processing units. Next, at each graphical processing unit, a coil sensitivity map is estimated using a subset of the k-space input data distributed to the respective graphical processing unit. Then, an iterative reconstruction algorithm is executed using the k-space input data and the coil sensitivity maps distributed across the graphical processing units.

According to one aspect of the present invention, as described in some embodiments, an iterative reconstruction algorithm includes applying an inverse Non-Uniform Discrete Fourier Transform to the k-space input data buffer to yield a plurality of first image space buffers, each first image space buffer corresponding to a unique channel and a unique temporal phase. Next, the first image space buffers are multiplied by an element-wise conjugate of the coil sensitivity map images to produce a plurality of second image space buffers. Then, the second image space buffers are aggregated together for each temporal phase, to produce a plurality of resulting image space buffers, each resulting image space buffer corresponding a distinct temporal phase. The iterative reconstruction algorithm may also include distributing each resultant image space buffer to a distinct graphical processing unit included in the plurality of graphic processing units. In one embodiment, the iterative reconstruction algorithm further comprises multiplying the resultant image space buffers by the coil sensitivity map images to yield a plurality of processed image space buffers, each processed image space buffer corresponding to a unique channel and a unique temporal phase. Then, a Non-Uniform Discrete Fourier Transform is applied to each processed image space buffer to create a plurality of resultant k-space data buffers, each resultant k-space data buffer corresponding to a unique channel and a unique temporal phase.

Some embodiments of the present invention are directed to a method for performing image reconstruction in a multi-threaded computing environment. The method includes receiving, by a plurality of first threads executing on one or more central processing units, input data comprising k-space sample data, k-space sample coordinate data, and k-space sample weight data. Next, a plurality of second threads executing on the one or more central processing units copy the input data onto a graphical processing unit device. The graphical processing unit device distributes the input data channel-wise across a plurality of graphical processing units located at the graphical processing unit device. At each graphical processing unit, an estimated coil sensitivity map is calculated based on the input data distributed to the respective graphical processing unit. Then, the graphical processing unit device executes a distributed reconstruction process across the graphical processing units using the estimated coil sensitivity maps to generate an image.

In some embodiments, the aforementioned method further includes copying, by one or more third threads executing on the one or more central processing units, the image from the graphical processing unit onto the one or more central processing units. In one embodiment, the distributed reconstruction process includes each graphical processing unit applying an inverse Non-Uniform Discrete Fourier Transformation to the input data distributed to the respective graphical processing unit to produce a first image. Next, each graphical processing unit multiplies the first image by an element-wise conjugate of the coil sensitivity map calculated at the respective graphical processing unit to yield a second image. Then, inter-device communication may be utilized between each of the plurality graphical processing units to aggregate together the second image at each of the graphical images to produce a temporal phase image.

According to one aspect of the present invention, as described in some embodiments, the distributed reconstruction process includes utilizing inter-device communication to multiply the estimated coil sensitivity map stored across the plurality of graphical processing images by a temporal phase images. Then, each graphical processing unit applies a Non-Uniform Discrete Fourier Transformation to the channel image to create a k-space sample set.

According to another aspect of the present invention, as described in some embodiments, calculating the estimated coil sensitivity map based on the input data distributed to the respective graphical processing unit includes segmenting the image space into overlapping tiles. Next, each overlapping tile is assigned to one of the graphical processing units. Then, each graphical processing unit applies a low-pass filter over a noise correlation matrix, approximates a dominant eigenvector for the noise correlation matrix using power iteration, and normalizes the dominant eigenvector versus a channel associated with the respective graphical processing unit.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

Figure 1:
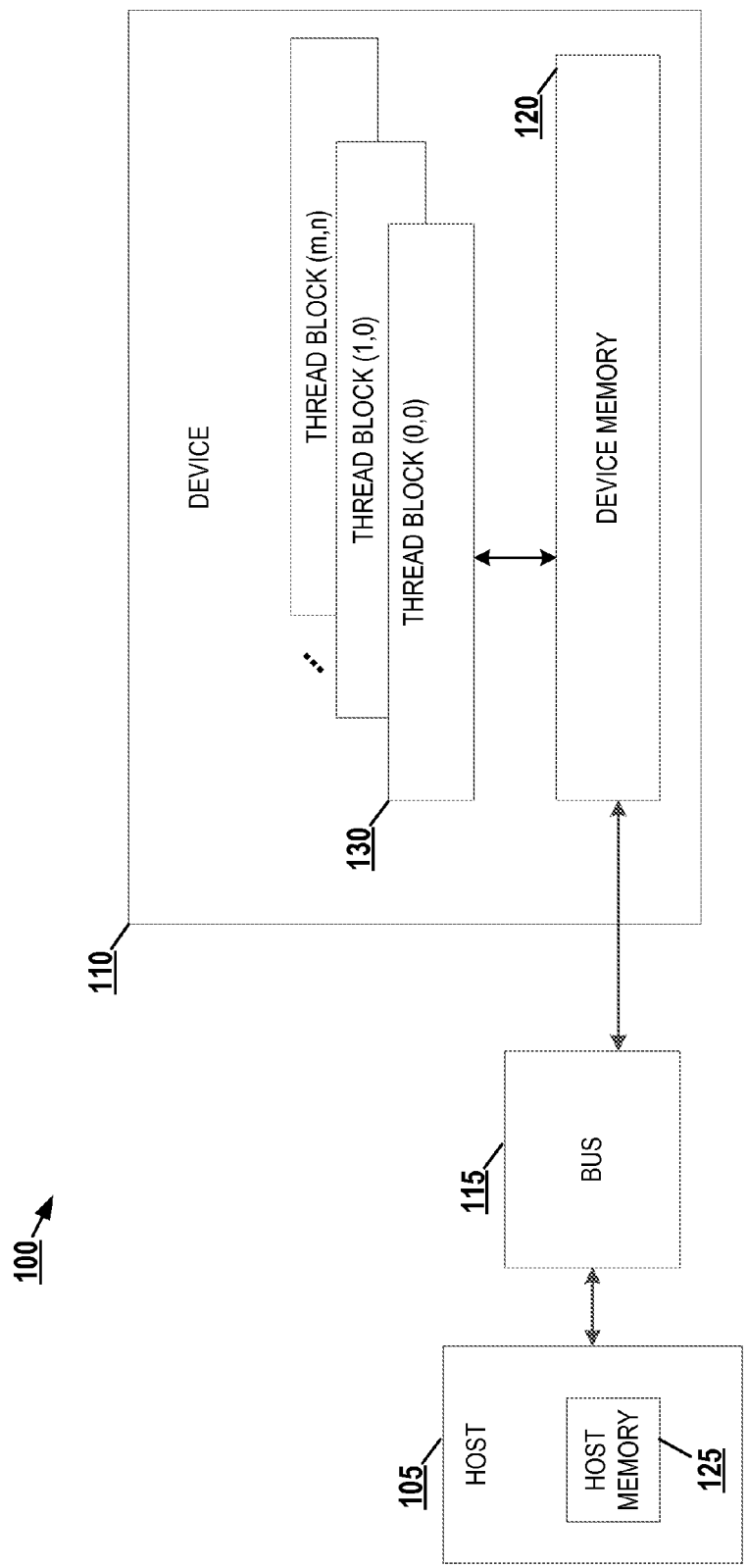
FIG. 1 provides an illustration of a memory architecture utilized by an image processing computer, according to some embodiments of present invention.

The following disclosure describes the present invention according to several example embodiments directed at applying reconstruction algorithms such as the Fast Iterative Shrinkage-Thresholding Algorithm ("FISTA") to reconstruct images from radial or other non-uniformly sampled k-space data. These algorithms are typically iterative and require a number of relatively computationally-intensive components. For example, these components may include components such as Non-Uniform Discrete Fourier Transforms (NUDFI's), 3D redundant Haar wavelet transforms, as well as vector arithmetic and aggregation operations such as norms and maximums. The present invention describes techniques for executing these components, along with other components related to image reconstruction, in parallel across a plurality of processing units. Thus, the present invention is well-suited, but not limited to, parallel computing environments such as the NVIDIA™ CUDA FIG. 1 provides an illustration of a memory architecture 100 utilized by an image processing computer according to some embodiments of present invention. This architecture may be used, for example, for embodiments of the invention where NVIDIA™ CUDA (or a similar parallel computing platform is used). The architecture includes a host 105 and a device 110 connected via a bus 115 (e.g., a PCIe bus). The host 105 includes the CPU (not shown in FIG. 1) and host memory 125 accessible to the CPU. The device 110 includes one or more GPUs (not shown in FIG. 1) and its associated memory 120, referred to herein as device memory.

The device 110 includes one or more thread blocks 130 which represent a computation unit of the device. The term thread block refers to a group of threads that can cooperate via shared memory and synchronize their execution to coordinate memory accesses. Depending on the parallel computing platform used, thread blocks may be organized in a grid structure. A computation or series of computations may then be mapped onto this grid. For example, in embodiments utilizing CUDA, computations may be mapped on a one-, two-, or three-dimensional grids. Each grid contains multiple thread blocks, and each thread block contains multiple threads. For example, in FIG. 1, the thread blocks 130 are organized in a two dimensional grid structure with m+1 rows and n+1 columns. Generally, threads in different thread blocks of the same grid will not communicate or synchronize with each other. However, thread blocks in the same grid may run on the same multiprocessor within the GPU at the same time. The number of threads in each thread block may be limited by hardware or software constraints.

In most computing architectures which use GPUs for data processing, the device does not have direct access to the host memory. Thus, in order for data to be processed by the GPUs, the host must copy data to and from the device. For example, in architectures based on CUDA, the processing flow may be described in four general steps. First, data is copied from main memory on the host component to device memory. The CPU on the host computer then instructs the device how to process the copied data with the GPUs. Next, one or more GPUs execute the instructions in parallel across its cores. Finally, the result is copied back from the device memory to the main memory on the device.

Because the ratio of the data to the computation may be substantial for some application, especially as the compute power available on the GPUs is increased either through the use of faster GPUs or more GPUs, in many embodiments the architecture 100 supports an overlap between I/O and computation. Additionally, in some embodiments, the algorithms executed on the architecture 100 may be designed to reduce the number of memory allocations performed, for example to reduce the memory fragmentation on the GPUs (due to the lack of virtual memory) and reduce the overhead involved with large memory allocations.

Figure 2:
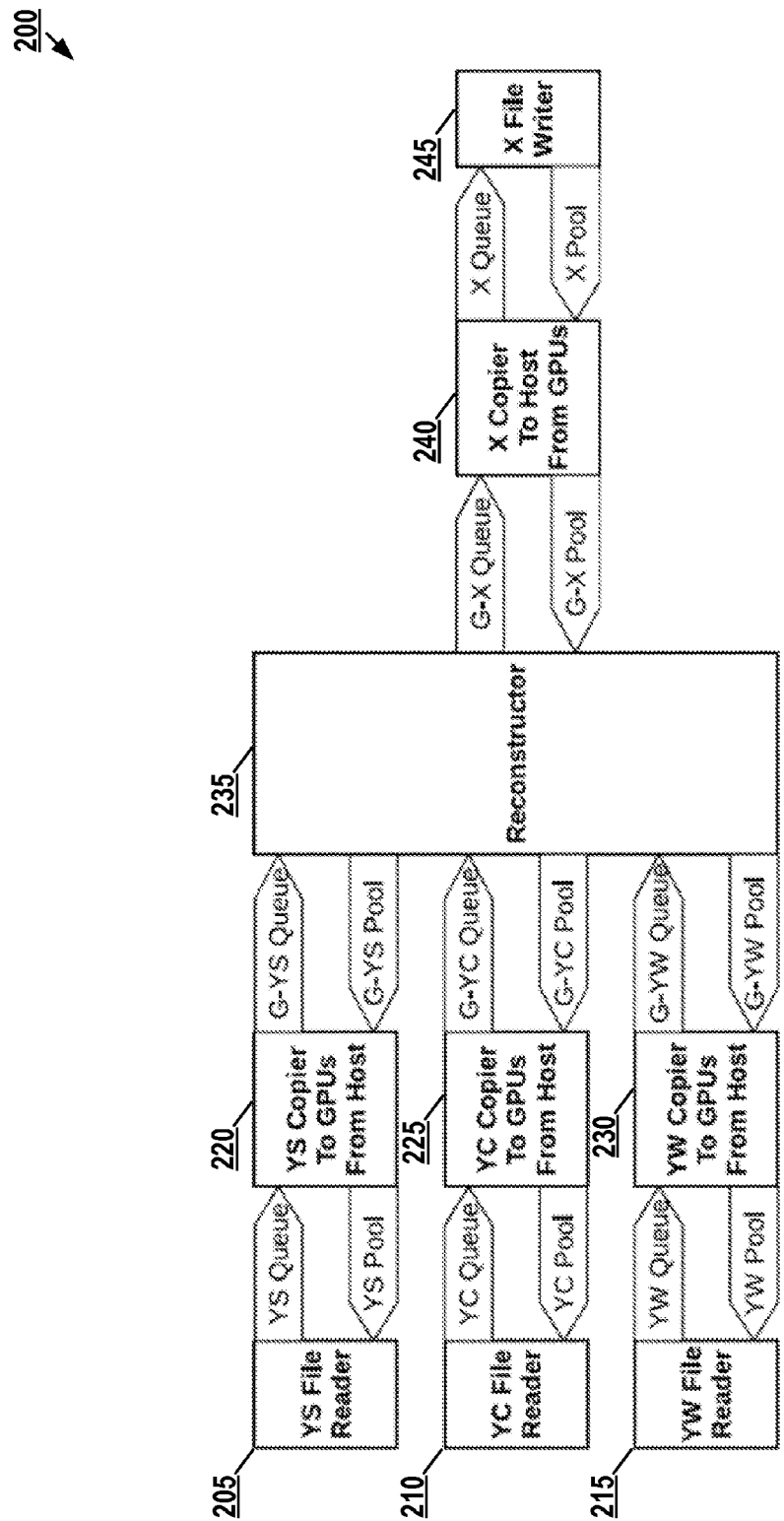
FIG. 2 provides a high-level system diagram illustrating the data flow between various components of the system, in some embodiments of the present invention.

FIG. 2 provides a high-level system diagram illustrating the data flow 200 between various components of the system, in some embodiments of the present invention. This data flow may be executed, for example, using the architecture 100 illustrated in FIG. 1. In some embodiments, the data flow is implemented based on a data flow graph where each node in the graph is a thread that may be simultaneously executed across one or more processing units (e.g., GPUs). For example, the system 200 of FIG. 2 involves 9 CPU threads (illustrated by square boxes), enabling reading, writing, copying, and reconstruction to be performed in parallel.

In FIG. 2, data is loaded into the system 100 via three file reader components: a k-space sample ("YS") file reader component 205; a k-space sample coordinates ("YC") file reader component 210; and a k-space sample weights ("YW") file reader component 215. These file reader components 205, 210, 215 may be implemented using any technique known in the art, for example, using standard methods or libraries included in a programming language. In some embodiments, the file reader components 205, 210, 215 read previously generated data from a file stored locally to or remotely from the system 100. In other embodiments, the file reader components 205, 210, 215 read a stream of "live" data gathered by an imaging system (e.g., an MRI system) in real-time or near real-time.

File reader components 205, 210, 215 are associated with copy components 220, 225, and 230, respectively. Each copy component performs one or more data processing operations to copy data from the host 105 to the device 110. Thus, for example, YS File Reader component 205 provides k-space sample data to copy component 220, which then copies the data to a device for processing by one or more GPUs. This copying may be performed, for example, by calling a memory copy function provided by an API associated with the parallel computing platform.

Continuing with reference to FIG. 2, a Reconstruction Component 235 executing on the device 110 receives k-space sample data, k-space sample coordinates, and k-space sample weights. The received data and information are then used to reconstruct an image ("X") using, for example, a sliding window reconstruction technique. In some embodiments, this reconstruction is performed in parallel across all the GPU cores available on the device 110.

Once the image has been reconstructed by the Reconstruction Component 235, a copy component 240 copies the data associated with the image from the device 110 back to the host 105. Then, a file writer component 245 writes the data associated with the reconstructed image to system memory. In some embodiments, the writer component 245 writes the data to non-volatile computing memory such as, for example, a hard disk drive or a solid-state drive. In other embodiments, the data is additionally or alternatively written to volatile memory (e.g., random access memory) or a network interface, for example, for presentation on a display.

In FIG. 2, data is transferred between components using multi-element data structures. These data structures allow each component to process data in an orderly manner. For example, in some embodiments, threads may pop inputs from a multi-element data structure (a form of the producer-consumer problem), perform a computation on the inputs, and then push the outputs to multi-element data structures. The multi-element data structures may be implemented using any suitable data structure known in the art including, without limitation, queues and stacks in various configurations. For example, in one embodiment, the multi-element data structures are queues that store elements in first-in first-out order ("FIFO").

In some embodiments, the multi-element data structures may be classified into one of two types: pool multi-element data structures and queue multi-element data structures. Pool multi-element data structures may be initialized at the start of the program to have N buffers, where N is the number of temporal phases in the sliding window. Queue multi-element data structures are initially empty. The general use pattern is that a node pops an "uninitialized but allocated" buffer off a pool multi-element data structure and performs some computation on it. Then, the node pushes it onto a queue multi-element data structure. Another node may then pop buffers from that queue multi-element data structure, perform additional computation, then either push the buffer back to the original pool multi-element data structure or push it onto another queue multi-element data structure. When a pop is attempted from an empty multi-element data structure, the thread blocks. Similarly, when a push is attempted to a full multi-element data structure, the thread blocks. This may eliminate the need for on-the-fly memory allocation and enforces flow control (and load balancing) between different components.

Pool multi-element data structures may be used both for CPU and GPU buffers. In the case of GPU buffers being used in the context of multiple GPUs, the buffers may be equally distributed across the GPUs. For example, in one embodiment, buffer i is allocated on GPU imodM where M is the number of GPUs. This provides for balanced data distribution and more balanced memory accesses in the course of some stages of computation.

Each of the threads depicted in FIG. 2 may utilize the multi-element data structures differently, depending on the functionality that is being performed by the thread. For example, tile reader nodes (e.g., 205, 210, 215) may continually pop buffers from a pool data structure, fill them with sequentially read data from disk, and push them to output queue data structure. File writer nodes (e.g., 245) may operate similarly but for writing, obtaining content from an input queues, and pushing the content when done onto an output pool. Copier nodes (e.g., 220, 225, 230) may copy contents between buffers, possibly on GPUs or CPUs. In some embodiments, such as illustrated in FIG. 2, copying involves four multi-element data structures: two pool data structures and two queue data structures. One pool is for returned input buffers, and the other pool is used to obtain output buffers. One queue is for input buffers, and the other queue is for resulting output buffers. The Reconstruction node (e.g., 235) performs computation using a tuple of YS, YC, YW, and X buffers, with the inputs being the YS, YC, and YW buffers and the output being the X buffer.

Figure 3:
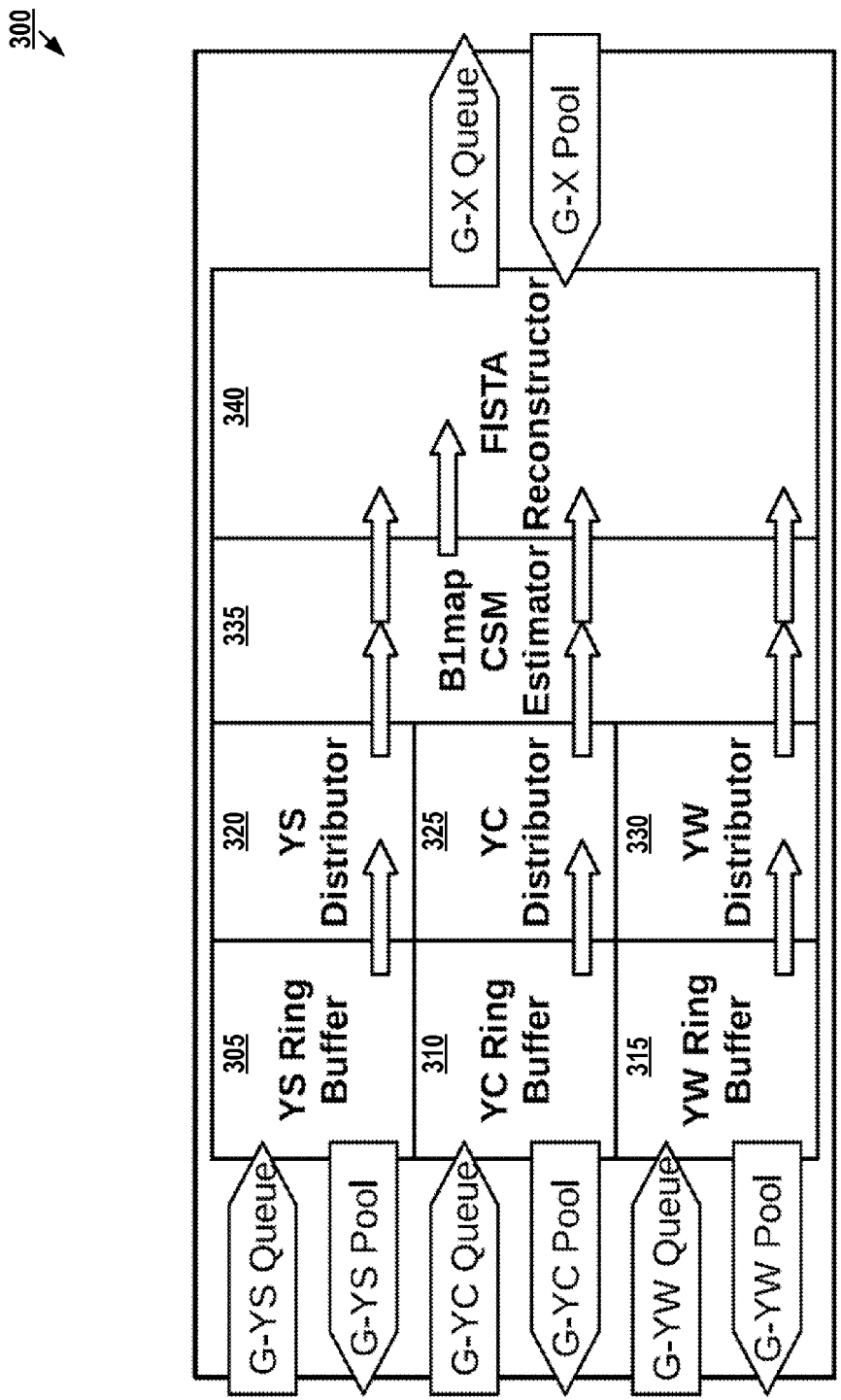
FIG. 3. illustrates a process performed by a reconstruction node as used in some embodiments of the present invention.

FIG. 3. illustrates a process 300 performed by a reconstruction node (e.g. 235 in FIG. 1), as used in some embodiments of the present invention. This process may be performed, for example, for each instance of a window processed by the reconstruction algorithm executed by the reconstruction node. In some embodiments, a new window reconstruction step can be done for each new sample that is streamed into the input, while in other embodiments the step is performed during a uniform or non-uniform temporal phase interval.

Briefly, the process 300 involves reorganizing the data for reconstruction, computing a coil sensitivity map (CSM), and then performing iterative reconstruction. In the example of FIG. 3, three ring buffer components are maintained: a k-space sample ("YS") ring buffer component 305; a k-space sample coordinates ("YC") ring buffer component 310; and a k-space sample weights ("YW") ring buffer component 315. Each ring buffer component 305, 310, 315 includes N buffer references, when the window is of length N. These buffer references correspond to the samples for all coils recorded in a single temporal phase.

In some embodiments, whenever a new 3-tuple (YS, YC, YW) of input buffers is obtained, the ring buffer components 305, 310, 315 are updated. As shown in FIG. 3, each ring buffer obtains new input buffers from a corresponding queue multi-element data structure. When a new buffer is added to the ring buffer component, any remaining buffer that expired from the ring buffer may be returned to its corresponding pool multi-element data structure. In some embodiments, no buffer memory copies are performed in this process and all of the buffers reside on the GPUs. To maintain a correspondence between the various tuples in the in the input buffers, the ring buffer components 305, 310, 315 may be synchronized using any synchronization technique known in the art.

Figure 4:
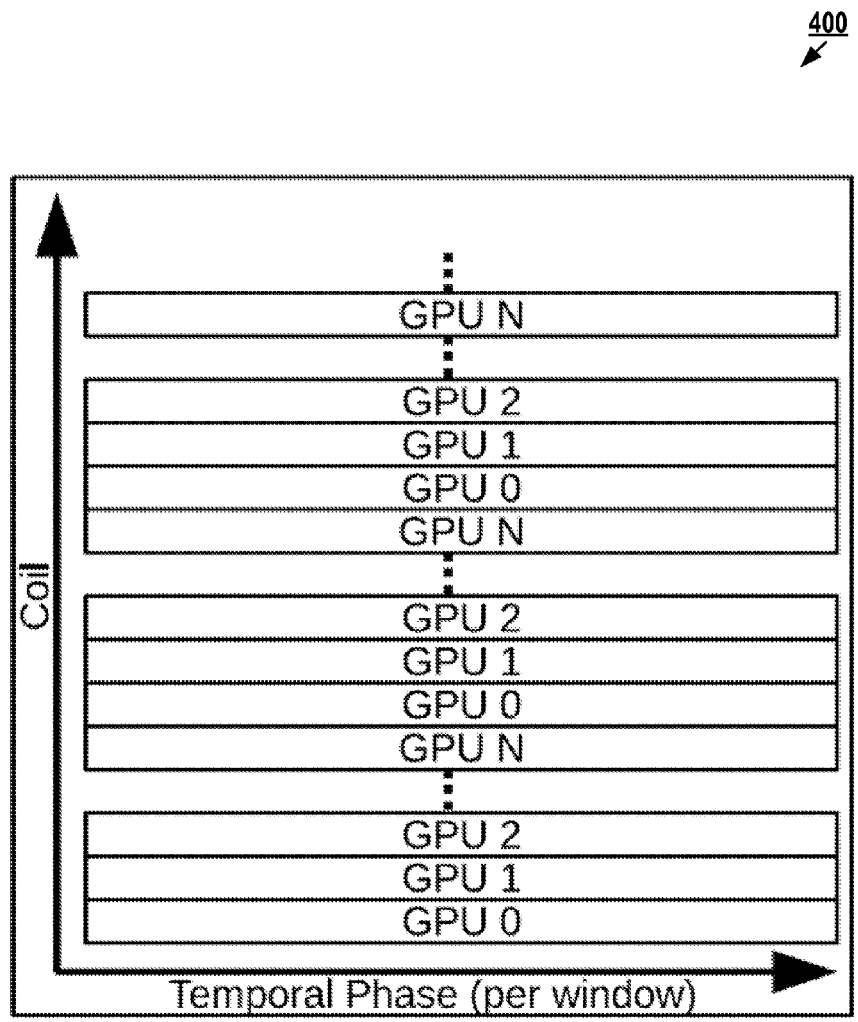
FIG. 4 is an illustration of k-space samples distributed channel-wise across GPUs, according to some embodiments of the present invention.

When reconstruction is performed for a window, the samples are distributed to the GPUs in a format appropriate for reconstruction. This distribution process is carried out in distributor steps 320, 325, 330 in FIG. 2. FIG. 4 illustrates an example configuration of GPUs 400 which distributes k-space samples channel-wise across the GPUs, as used in some embodiments of the present invention. To improve signal quality, each element of an MRI coil system may be associated with a dedicated radio frequency channel whose output is processed and combined with the outputs of other channels (signals acquired by the other coil elements). Thus, in the configuration shown in FIG. 4, each GPU receives k-space sample data corresponding to one element of the coil. Such a configuration may be used for the purposes of estimation of the CSM and reconstruction. For example, in one embodiment, after sample distribution is performed, the CSM is estimated for the set of samples. With the CSM (distributed channel-wise across the GPUs) and the distributed samples, a reconstruction procedure is executed. In some embodiments, an iterative reconstruction procedure such as FISTA is executed. The absolute value of the samples in the resulting buffer from reconstruction may then be placed into the X (reconstructed image) buffer popped from the X pool.

In one embodiment, the iterative reconstruction procedure is a FISTA algorithm comprising three nested loops. In outer to inner order they are as follows. First, a main loop iterates until either the iteration count constraints are satisfied or the change in the solution for each iteration becomes sufficiently small. The basic structure may be, for example, that of gradient descent, with some techniques to improve convergence. Second, a line search loop searches using the gradient for the next step in the gradient descent process. Third, a proximal operator loop applies the redundant Haar operator and soft thresholding to expose sparsity in the solution.

Three different groups of variables may be used in the iterative reconstruction procedure. First, image-space variables store one element per image and one image per window temporal phase. Second, k-space variables store one element per k-space sample. A set of samples exists for each channel for each window temporal phase. Third, wavelet-space variables store a predetermined number of elements per image space sample. For example, in some embodiments, the wavelet-space variables store a predetermined number of elements per image space sample. One redundant wavelet transformed image exists per window temporal phase.

Figure 5:
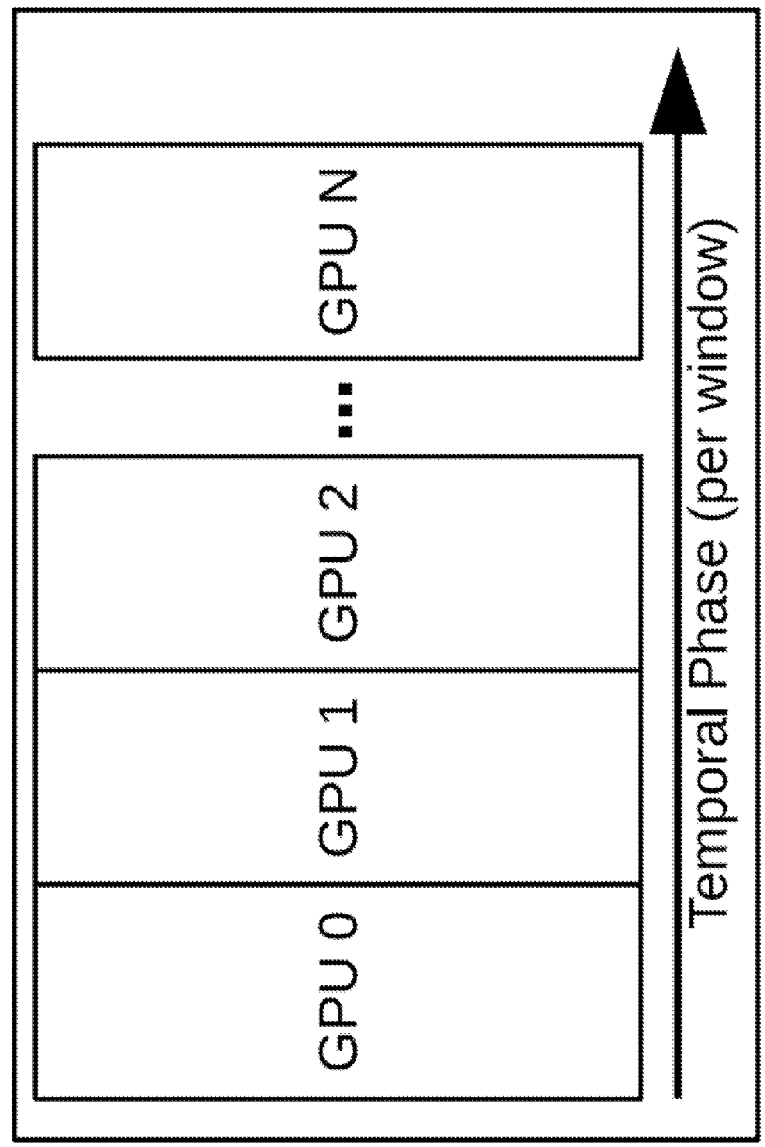
FIG. 5 is an illustration of image-space samples distributed by temporal phase across GPUs, according to some embodiments of present invention.

In some embodiments, while the k-space samples are distributed channel-wise across the GPUs, as in FIG. 4, the image and wavelet space samples are distributed temporal phase wise across the GPU as shown in the configuration 500 illustrated in FIG. 5. Temporal blocks of samples may be distributed to different GPUs so that each GPU gets a contiguous set of temporal phases. This enables more efficient operation the reconstruction procedure.

In embodiments where the iterative reconstruction procedure is FISTA, the invention described herein may include one or more additional features which allow for efficient execution of the algorithm in a parallel computing environment. Most operations performed during the FISTA process fall into one of five categories: vector arithmetic, memory movement, reductions, Fourier transforms, and wavelet transforms. The vector arithmetic and memory movement is implemented by executing kernel calls, for each operator, for each GPU. In some embodiments, no synchronization is used except where absolutely necessary. For reductions, the nature of the reduction determines how it is implemented. In one embodiment, computing a norm or max of a multi-GPU distributed buffer is done by using the NVIDIA™ CUDA Basic Linear Algebra Subroutines ("cuBLAS") library to compute the norm on each GPU, then performing a reduction of the individual GPU results on the CPU (which is trivial.) For sum reductions, e.g., between images on multiple GPUs, the reduction may be done with a linear time loop.

With respect to the Fourier transformations, FISTA utilizes an A operator to transform a set of image space samples to k-space, and an AT operator to transform a set of k-Space samples to image space. In some embodiments of the present invention, the A and AT operators are the primary point where inter-CPU communication is performed in the FISTA reconstruction process. To transform samples from the image space to the k-space (A), the samples are first multiplied by the CSM images, yielding one image per channel per temporal phase. Then, a Non-Uniform Discrete Fourier Transform ("NUDFT") is applied to each of these images, creating one k-space sample set per channel per temporal phase. Inter-device communication occurs where the channel-distributed CSMs are multiplied by the temporal phase-distributed k-space images. For the inverse (AT), the inverse NUDFT is applied, producing one image per coil per temporal phase. The images are then multiplied by the element-wise conjugate of the CSM images. The resulting images are then summed together, for each temporal phase, to produce one image per temporal phase. Inter-device communication occurs during the reduction step.

With respect to the wavelet transformations, FISTA utilizes a W operator to transform an image space buffer to wavelet space, and a WT operator to transform a wavelet space buffer to image space. In some embodiments of the present invention, the W and WT operators are an additional point where inter-GPU communication occurs. These operators may be implemented, for example, using 2×2×2 tensor multiplies. The W operator may also incorporate a temporal scaling coefficient. This enables the operations to be implemented in a single kernel call (e.g., in the case of a single GPU.)

For the W operator, in one embodiment, the tensor multiplier is applied similarly to a convolution over the image, with overlapping 2×2×2 blocks. In this embodiment, the result is a volume 8 times larger than the input. For the WT operator, the tensor multiplier is applied per 2×2×2 non-overlapping block in the wavelet domain. This results in an intermediate result 8 times larger than the image space, which can then be reduced by summing each 2×2×2 block. To fold this reduction pass into the WT operator kernel itself, rather than using an additional reduction kernel call, atomic add operations are used in the context of a single GPU.

To accomplish this with the WT operator in embodiments of the present invention where the samples are temporal-phase distributed across multiple GPUs (e.g., as in FIG. 5), actions may be performed to address the atomic add operations at the boundaries of the volume distributed to each GPU. These actions may be performed for each of N devices, for example, by calling the WT kernel N times. At any given time, a buffer on a GPU may only be written by at most one other GPU (via a write mask), with the kernels not repeating computation for any target position. Because the samples are temporal phase-distributed block-wise (e.g., as in FIG. 5), rather than via interleaving, and the kernel checks the write mask as an early termination condition, this does not introduce a large amount of overhead.

While the reconstruction is performed for all temporal phases of a window, only one of the temporal phases may be used for the result. However, the remaining phases can be passed on to the next invocation of the reconstruction algorithm to enable warm start, potentially reducing the number of iterations required.

BImap CSM estimation effectively computes a correlation matrix across all channels independently for each image space plus time (width×height×temporal phase) position. A low-pass filter is applied over the correlation matrices, element-wise. The dominant eigenvector is then approximated for each correlation matrix using power iteration. The resulting vectors are normalized versus one of the channels. The result from this is the coil sensitivity map image (width×height×temporal phase×channel). Because the size of these matrices may be large, in some embodiments where a GPU implementation is used, the image space is segmented into tiles. Because of the neighborhood of support required by the low pass filter, the tiles may have some overlap, resulting in some wasted computation, Multiple GPUs are supported by utilizing temporal phase distribution across the GPUs. This can be done because the computation for each temporal phase is independent.

As noted above, the NUDFT may be used to evaluate the A and AT operators. In the present invention different implementations of the NUDFT may be used depending on whether accuracy or speed is prioritized.

For example, in one embodiment, a direct version of the NUDFT evaluates the following equations which are inefficient, but accurate. The forward direct NUDFT used by the A operator is defined by $$Y_l = (N_1 N_2)^{-\frac{1}{2}} \sum_{j=1}^{N_1} \sum_{k=1}^{N_2} X_{j,k} \exp\left[-iC_{l_1}\left(j - \frac{N_1}{2}\right) - iC_{l_2}\left(k - \frac{N_2}{2}\right)\right]$$

and the inverse direct NUDFT used by the AT operator is defined by $$X_{j,k} = (N_1 N_2)^{-\frac{1}{2}} \sum_{l=1}^{M} Y_l \exp\left[iC_{l_1}\left(j - \frac{N_1}{2}\right) + iC_{l_2}\left(k - \frac{N_2}{2}\right)\right]$$

where $X_{j,k}$ is the image space sample at $<j, k>$, $Y_l$ is the l-th Fourier-domain sample, $C_{l_1}$ is the first coordinate of the l-th Fourier domain sample, $C_{l_2}$ is the second coordinate of the l-th Fourier domain sample, $N_1$ is the number of image space samples in the first dimension, $N_2$ is the number of image space samples in the second dimension, and M is the number of Fourier domain samples. In embodiments which utilize uniform sampling, the equations set out above may be reduced to their conventional DFT counterparts.

In some embodiments, the GPU implementation of the forward operator assigns one Fourier-domain sample per CUDA kernel thread and the inverse operator assigns one image-space sample per CUDA kernel thread. This produces a write-once, read-many paradigm, improving cache coherence.

In embodiments where speed is prioritized, a scattering Non-Uniform Fast Fourier Transform ("NUFFT") may be used. The NUFFT converts the problem to a uniform DFT, enabling the use of conventional FFT algorithms. Both the forward and inverse transformations make use of a "sample buffer", which has the same dimensions of the image space buffer. The forward transformation makes use of a "gather buffer" as well.

The forward transformation performs the operation directly in the input image, writing the results into the sample buffer. A gather buffer is then initialized to zero. Fourier-domain samples are scattered out to the gather buffer such that the image space origin corresponds to $<-\pi, -\pi>$ and the image space maximum coordinate corresponds to $<+\pi, +\pi>$. Every time a sample occurs in a gather buffer cell, the value is incremented. Once this buffer is initialized, every output sample coordinate's corresponding sample buffer sample is fetched, then divided by the gather buffer's value at that position. Scaling is then performed by $$(N_1, N_2)^{-\frac{1}{2}}.$$

The inverse transformation first initializes the sample buffer to zero. Samples are scattered (i.e., added) out to the sample buffer, similarly to how the forward transformation gathers samples (e.g., using the same image to Fourier domain position transformation). The IFFT is then performed on this buffer, and the buffer is subsequently scaled by $$(N_1, N_2)^{-\frac{1}{2}}.$$

Figure 6:
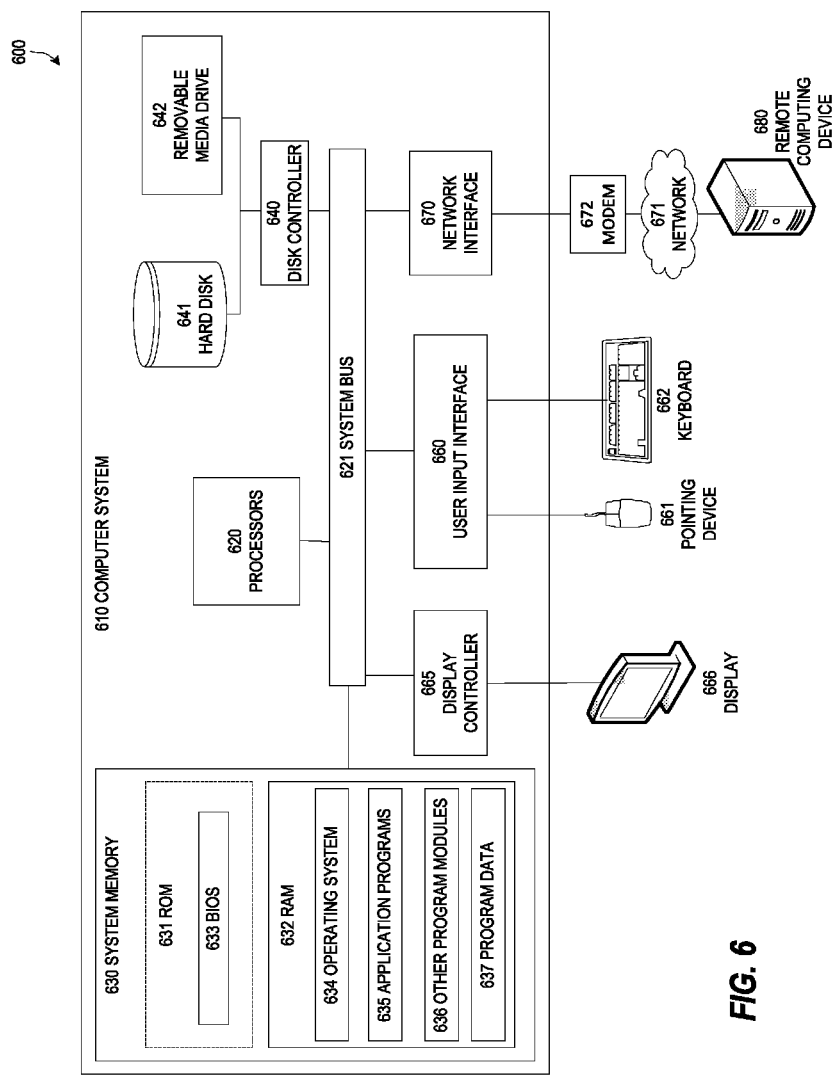
FIG. 6 illustrates an example of a computing environment within which embodiments of the invention may be implemented.

FIG. 6 illustrates an example of a computing environment 600 within which embodiments of the invention may be implemented. Computing environment 600 may include computer system 610, which is one example of a computing system upon which embodiments of the invention may be implemented. Computers and computing environments, such as computer 610 and computing environment 600, are known to those of skill in the art and thus are described briefly here.

As shown in FIG. 6, the computer system 610 may include a communication mechanism such as a bus 621 or other communication mechanism for communicating information within the computer system 610. The system 610 further includes one or more processors 620 coupled with the bus 621 for processing the information. The processors 620 may include one or more CPUs, GPUs, or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system 633 (BIOS) containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 636.

The computer system 610 also includes a disk controller 640 coupled to the bus 621 to control one or more storage devices for storing information and instructions, such as a magnetic hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display or monitor 665, such as a cathode ray tube (CRT) or liquid crystal display (LCD), for displaying information to a computer user. The computer system includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hard-wired circuitry may be used in place of or in combination with software instructions. Thus, embodiments are not limited to any specific combination of hardware circuitry and software.

As stated above, the computer system 610 may include at least one computer readable medium or memory for holding instructions programmed according embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 620 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer 610. When used in a networking environment, computer 610 may include modem 662 for establishing communications over a network 661, such as the Internet. Modem 662 may be connected to system bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computing system 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system for performing image reconstruction in a multi-threaded computing environment, the system comprising:
one or more central processing units executing a plurality of k-space components, the k-space components comprising:
a k-space sample data component operating in a first thread and configured to receive k-space sample data from a first file interface,
a k-space sample coordinate data component operating in a second thread and configured to receive k-space sample coordinate data from a second file interface, and
a k-space sample weight data component operating in a third thread and configured to retrieve k-space sample weight data from a third file interface; and
a reconstruction component configured to reconstruct an image using a plurality of graphic processing units, the reconstruction component configured to:
receive one or more k-space input data buffers comprising the k-space sample data, the k-space sample coordinate data, and the k-space sample weight data from the central processing units,
distribute the one or more k-space input data buffers channel-wise across the graphic processing units,
generate a coil sensitivity map distributed channel-wise across the plurality of graphic processing units, and
reconstruct the image based on the one or more k-space input data buffers and the coil sensitivity map using an iterative reconstruction algorithm.

2. The system of claim 1, wherein the plurality of k-space components executing on the central processing units further comprise:
a k-space sample data copy component operating in a fourth thread and configured to transfer the k-space sample data from the k-space sample data component to the graphic processing units in a first k-space input data buffer;
a k-space sample coordinate data copy component operating in a fifth thread and configured to transfer the k-space sample coordinate data from the k-space sample coordinate data component to the graphic processing units in a second k-space input data buffer; and
a k-space sample weight data copy component operating in a sixth thread and configured to transfer the k-space sample weight data from the k-space sample weight data component to the graphic processing units in a third k-space input data buffer.

3. The system of claim 2, wherein the first k-space input data buffer, the second k-space input data buffer, and the third k-space input data buffer each comprise synchronized multi-element data structures.

4. The system of claim 2, wherein each of the plurality of k-space components executes in parallel on the one or more central processing units.

5. The system of claim 1, wherein the k-space input data buffers are distributed to each graphic processing unit based on a number of available graphic processing units.

6. The system of claim 1, wherein the reconstruction component is further configured to:
apply an inverse Non-Uniform Discrete Fourier Transform to the k-space input data buffers to yield a plurality of first image space buffers, each first image space buffer corresponding to a unique channel and a unique temporal phase;
at each graphic processing unit, multiply the first image space buffers by an element-wise conjugate of the coil sensitivity map at the respective graphic processing unit to produce a second image space buffer; and
aggregate each respective second image space buffers from each respective graphic processing unit together for each temporal phase, to produce a plurality of resulting image space buffers, each resulting image space buffer corresponding a distinct temporal phase.

7. The system of claim 6, wherein the reconstruction component is further configured to: distribute each resultant image space buffer to a distinct graphic processing unit included in the plurality of graphic processing units.

8. The system of claim 6, wherein the reconstruction component is further configured to:
multiply the resulting image space buffers by the coil sensitivity map to yield a plurality of processed image space buffers, each processed image space buffer corresponding to a unique channel and a unique temporal phase; and
apply a Non-Uniform Discrete Fourier Transform to each processed image space buffer to create a plurality of resulting k-space data buffers, each resulting k-space data buffer corresponding to a unique channel and a unique temporal phase.

9. The system of claim 8, wherein inter-device communication is used between the graphic processing units when multiplying samples from image space by the coil sensitivity map.

10. A system for performing image reconstruction in a multi-threaded computing environment, the system comprising:
one or more central processing units executing a plurality of k-space components configured to receive k-space input data, the k-space components executing in parallel on the central processing units; and
a graphic processing unit device comprising a plurality of graphic processing units, the graphic processing unit device configured to:
receive a plurality of k-space input data buffers comprising the k-space input data from the k-space components,
distribute the k-space input data channel-wise across the graphic processing units,
at each graphic processing unit, estimate a coil sensitivity map using a subset of the k-space input data distributed to the respective graphic processing unit, and
execute an iterative reconstruction algorithm using the k-space input data and the coil sensitivity maps from the graphic processing units.

11. The system of claim 10, wherein the iterative reconstruction algorithm comprises:
applying an inverse Non-Uniform Discrete Fourier Transform to the plurality of k-space input data buffers to yield a plurality of first image space buffers, each first image space buffer corresponding to a unique channel and a unique temporal phase;
multiplying the first image space buffers by an element-wise conjugate of the coil sensitivity map to produce a plurality of second image space buffers; and
aggregating each respective second image space buffer together for each temporal phase, to produce a plurality of resulting image space buffers, each resulting image space buffer corresponding a distinct temporal phase.

12. The system of claim 11, wherein the iterative reconstruction algorithm further comprises:
distributing each resultant image space buffer to a distinct graphic processing unit included in the plurality of graphic processing units.

13. The system of claim 11, wherein the iterative reconstruction algorithm further comprises:
multiplying the resulting image space buffers by the coil sensitivity map to yield a plurality of processed image space buffers, each processed image space buffer corresponding to a unique channel and a unique temporal phase; and
applying a Non-Uniform Discrete Fourier Transform to each processed image space buffer to create a plurality of resulting k-space data buffers, each resulting k-space data buffer corresponding to the unique channel and the unique temporal phase.

14. A method for performing image reconstruction in a multi-threaded computing environment, the method comprising:
receiving, by a plurality of first threads executing on one or more central processing units, input data comprising k-space sample data, k-space sample coordinate data, and k-space sample weight data;
copying, by a plurality of second threads executing on the one or more central processing units, the input data onto a graphic processing unit device;
distributing, by the graphic processing unit device, the input data channel-wise across a plurality of graphic processing units located at the graphic processing unit device;
at each graphic processing unit, calculating an estimated coil sensitivity map based on the input data distributed to the respective graphic processing unit, and
executing, by the graphic processing unit device, a distributed reconstruction process across the graphic processing units using the estimated coil sensitivity maps to generate an image.

15. The method of claim 14, further comprising:
copying, by one or more third threads executing on the one or more central processing units, the image from the graphic processing unit onto the one or more central processing units.

16. The method of claim 14, wherein the distributed reconstruction process comprises:
at each graphic processing unit,
applying an inverse Non-Uniform Discrete Fourier Transformation to the input data distributed to the respective graphic processing unit to produce a first image; and multiplying the first image by an element-wise conjugate of a respective estimated coil sensitivity map calculated at the respective graphic processing unit to yield a second image.

17. The method of claim 16, further comprising:
utilizing inter-device communication between each of the plurality of graphic processing units to aggregate together the second image at each of the graphical images to produce a temporal phase image.

18. The method of claim 16, wherein the distributed reconstruction process comprises:
utilizing inter-device communication to multiply the estimated coil sensitivity map stored across the plurality of graphic processing units by temporal phase images to yield a channel image for each graphic processing unit;
at each graphic processing unit, applying a Non-Uniform Discrete Fourier Transformation to a corresponding channel image to create a k-space sample set.

19. The method of claim 16, wherein calculating the estimated coil sensitivity map based on the input data distributed to the respective graphic processing unit, comprises:
segmenting an image space buffer into overlapping tiles;
assigning each overlapping tile to one of the graphic processing units;
at each graphic processing unit,
applying a low-pass filter over a noise correlation matrix;
approximating a dominant eigenvector for the noise correlation matrix using power iteration, and
normalizing the dominant eigenvector versus a channel associated with the respective graphic processing unit.

* * * * *